(12) United States Patent
Kanda

(10) Patent No.: US 8,428,763 B2
(45) Date of Patent: Apr. 23, 2013

(54) MANAGEMENT APPARATUS, EXPOSURE METHOD, AND METHOD OF MANUFACTURING DEVICE

(75) Inventor: Tsuneo Kanda, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 432 days.

(21) Appl. No.: 12/880,727

(22) Filed: Sep. 13, 2010

(65) Prior Publication Data

US 2011/0063593 A1 Mar. 17, 2011

(30) Foreign Application Priority Data

Sep. 14, 2009 (JP) .................................. 2009-212513

(51) Int. Cl.
G06F 19/00 (2006.01)
G03B 27/32 (2006.01)

(52) U.S. Cl.
USPC ........................................... 700/121; 355/77

(58) Field of Classification Search ......................... None
See application file for complete search history.

(56) References Cited

U.S. PATENT DOCUMENTS

| 2002/0100013 | A1* | 7/2002 | Miwa et al. ..................... 716/21 |
| 2003/0088847 | A1* | 5/2003 | Chang et al. .................... 716/19 |
| 2006/0114437 | A1* | 6/2006 | Akhssay et al. ............... 355/55 |
| 2007/0185606 | A1* | 8/2007 | Kemmoku .................... 700/121 |

FOREIGN PATENT DOCUMENTS

JP 4-013548 A 1/1992

\* cited by examiner

*Primary Examiner* — Toan Ton
*Assistant Examiner* — Michelle Iacoletti
(74) *Attorney, Agent, or Firm* — Rossi, Kimms & McDowell LLP

(57) ABSTRACT

A management apparatus obtains a list of a plurality of lots for which exposure processes are reserved, an initial value of an aberration of a projection optical system before start of the exposure processes of the plurality of lots, and an allowable value of the aberration of the projection optical system for each of the plurality of lots, generates candidates for an order of the plurality of lots based on the obtained list, calculates a time from start of an exposure process of the first lot until end of an exposure process of the last lot while adjusting time intervals between the lots so that the aberration of the projection optical system in the exposure process of each of the plurality of lots falls below the allowable value, and determines a processing order of the plurality of lots based on the calculated time.

8 Claims, 8 Drawing Sheets

A. WHEN CHANGE IN ABERRATION IS NOT TAKEN INTO CONSIDERATION

B. WHEN CHANGE IN ABERRATION IS TAKEN INTO CONSIDERATION

MANAGEMENT APPARATUS, EXPOSURE METHOD, AND METHOD OF MANUFACTURING DEVICE

BACKGROUND OF THE INVENTION

1. Field of the Invention

The present invention relates to a management apparatus that manages an exposure apparatus, an exposure method that uses the management apparatus, and a method of manufacturing a device using the exposure method.

2. Description of the Related Art

In recent years, semiconductor technologies are progressing at an increasing pace. To keep up with this trend, micropatterning techniques are also making remarkable progress. Especially photofabrication techniques using exposure apparatuses, which play a central role in the manufacture of semiconductors, have achieved the formation of patterns with feature sizes as small as 100 nm or less. To enhance the productivities of such exposure apparatuses, the types and timings of lots to be fed to them are controlled online in semiconductor device factories. On a semiconductor production line including a plurality of production processing steps, product groups as processing objects, and lots as semifinished product groups are transferred to each step in accordance with a predetermined step order, and undergo predetermined production processing in each step. On the above-mentioned production line, a wide variety of lots are processed in parallel. In each step mentioned above, the lots which have arrived at the step are classified based on their degrees of urgency (the degrees of urgency of production processing completion), and lots with high degrees of urgency are assigned higher priority levels in the order of arrival at the step, and are processed in accordance with the priority levels. Alternatively, in each step, the operator determines the processing order of lots according to circumstances involved, and their processing takes place. However, when the processing order of lots is determined using only two types of information: the degrees of urgency and the order of arrival in each step, as described earlier, this is insufficient to reflect the actual conditions of each step, which change with time, such as the number of workpieces in each step, and the degree of progress of production processing of each lot. Therefore, it is often the case that lots including relatively large numbers of workpieces are processed ahead of those including relatively small numbers of workpieces, and are transferred to the next step, resulting in nonuniformity in load imposed on each step. This degrades the production efficiency over the entire production line.

To combat this situation, Japanese Patent Laid-Open No. 4-13548 discloses a method of assigning priority levels to processing objects by the following procedure, and a management apparatus which performs this method. First, a plurality of evaluation items for determining the index of the order of priority are determined in advance based on the status of production processing, and the status of production processing, which is necessary to evaluate these items, is detected. Next, the evaluation index of each evaluation item is obtained for each processing object based on the detection result. The evaluation indices are weighted to adjust the degrees of influence that the evaluation items exert on the order of priority, the weighted evaluation indices are summed up for each processing object, and higher priority levels are assigned in turn from a processing object with a largest summed evaluation index.

To fabricate a semiconductor device, an exposure apparatus transfers an electronic circuit pattern onto a silicon wafer (to be simply referred to as a wafer hereinafter) which serves as a foundation for fabricating the semiconductor device. This exposure apparatus includes a projection optical system with its aberration known to change depending on exposure energy, which is supplied to the projection optical system and determined based on the exposure conditions under which the wafer is processed. The exposure conditions which exert an influence on the aberration of the projection optical system are, for example, the illumination mode, a diffracted light distribution generated by the pattern of a reticle, the exposure processing time, the reticle transmittance, the shot area, the number of shots, the reflectance of the wafer surface, the resist type and film thickness, the resist process, and the exposure dose. The technique described in Japanese Patent Laid-Open No. 4-13548 sets the order of priority in accordance with the status of production processing, but does not take account of a change in aberration of a projection optical system of an exposure apparatus. To overcome this situation, with a technique which has recently been developed, an aberration correction system is mounted in a projection optical system to cancel a change in aberration upon partially absorbing exposure energy by the projection optical system, thereby suppressing the change in aberration upon absorbing exposure energy by the projection optical system.

Unfortunately, high-order aberrations to be corrected often remain in the aberration correction system, depending on the exposure energy distribution in the projection optical system. In this case, to expose the wafer free from any positional shift, lot charging into the exposure apparatus needs to be suspended until the aberration of the projection optical system falls below an allowable value. Therefore, the conventional technique poses a problem that the number of wafers processed per day is relatively small, and this degrades the productivity. Also, to suppress the change in aberration upon absorbing exposure energy by the projection optical system, another method slows down the processing speed so as to prevent the exposure energy from exceeding a preset limit. However, this method poses a problem that the number of wafers processed per day is relatively small as well.

SUMMARY OF THE INVENTION

The present invention provides a management apparatus which shortens the time taken to complete exposure processes of all substrates in a plurality of lots.

According to the present invention, there is provided a management apparatus which manages an exposure apparatus that projects a pattern of a reticle onto a substrate via a projection optical system to expose the substrate, wherein the management apparatus obtains a list of a plurality of lots for which exposure processes are reserved, an initial value of an aberration of the projection optical system before start of the exposure processes of the plurality of lots, and an allowable value of the aberration of the projection optical system, below which the exposure process can be performed, for each of the plurality of lots, generates candidates for an order of the plurality of lots, for which the exposure processes are reserved, based on the obtained list, calculates a time, from start of an exposure process of the first lot until end of an exposure process of the last lot, for each of the generated candidates for the order while adjusting time intervals between the lots so that the aberration of the projection optical system in the exposure process of each of the plurality of lots falls below the allowable value for a corresponding lot, and determines a candidate for the order, according to which the calculated time minimizes, as a processing order of the plurality of lots.

Further features of the present invention will become apparent from the following description of exemplary embodiments with reference to the attached drawings.

DESCRIPTION OF THE EMBODIMENTS

Embodiments of the present invention will be described in detail below with reference to the accompanying drawings.

First Embodiment

Figure 1:
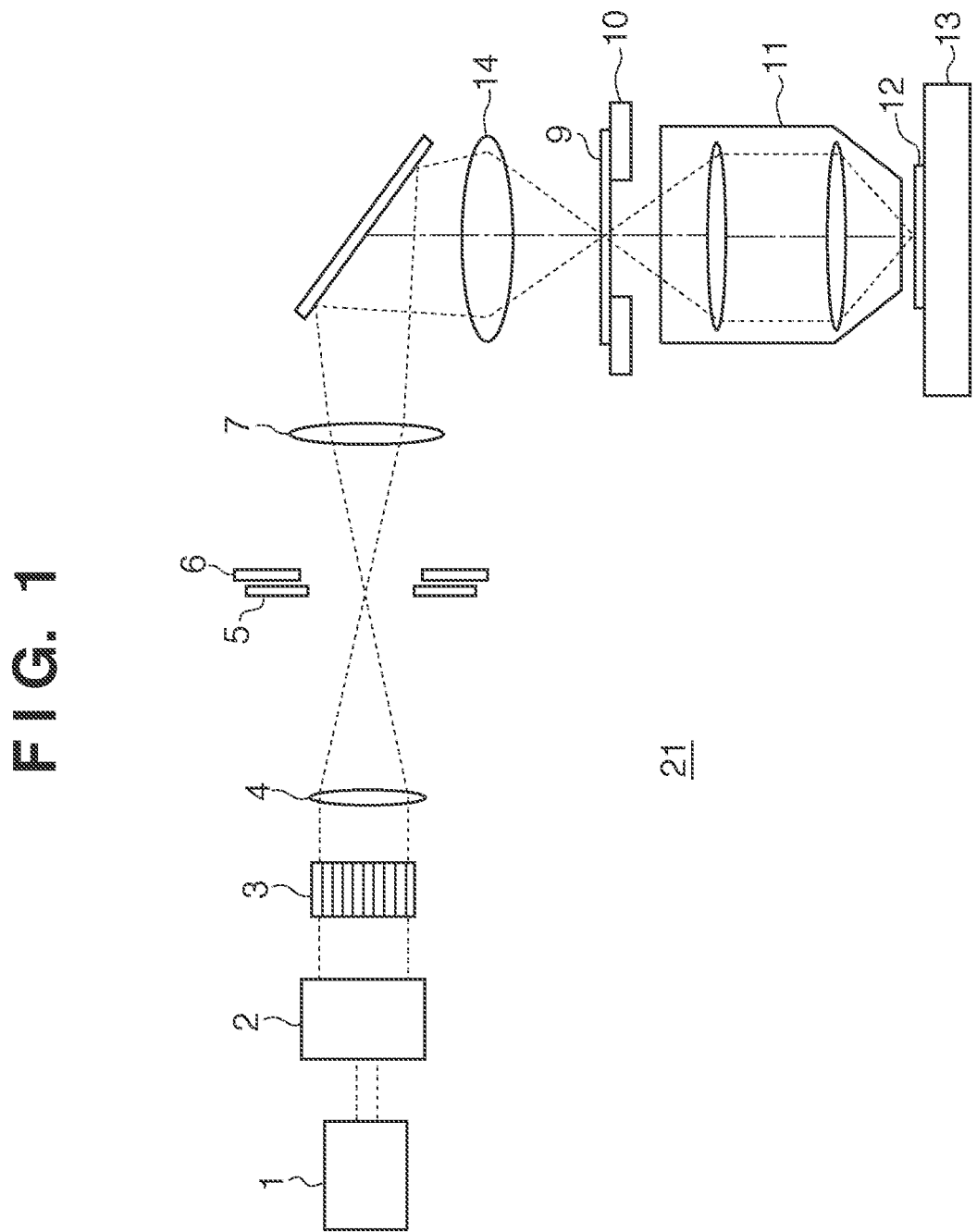
FIG. 1 is a view that depicts an exposure apparatus.

FIG. 1 is a view illustrating an example of an exposure apparatus which exposes a substrate and can be used in the present invention. Referring to FIG. 1, a beam shaping optical system 2 controls the intensity distribution and angular distribution of a light beam which is emitted by a light source 1 and is incident on an optical integrator 3 that is placed on its immediately downstream side and forms an effective light source. A condenser lens 4 converges the light beam emerging from the optical integrator 3. A variable slit 5 uniforms the illuminance on the exposure surface after scanning exposure. A scanning blade 6 limits the exposure range on the wafer, and scans in synchronism with a reticle stage 10 and wafer stage (substrate stage) 13. Imaging lenses 7 and 14 transfer the aperture shape of the scanning blade 6 onto the surface of a reticle 9. The reticle 9 has a pattern formed on it, and is held and scanned by the reticle stage 10. The pattern of the reticle 9 is projected and transferred onto a wafer (substrate) 12 via a projection optical system 11. The wafer 12 is held by the wafer stage 13 which is movable in the X, Y, and Z directions.

Figure 2:
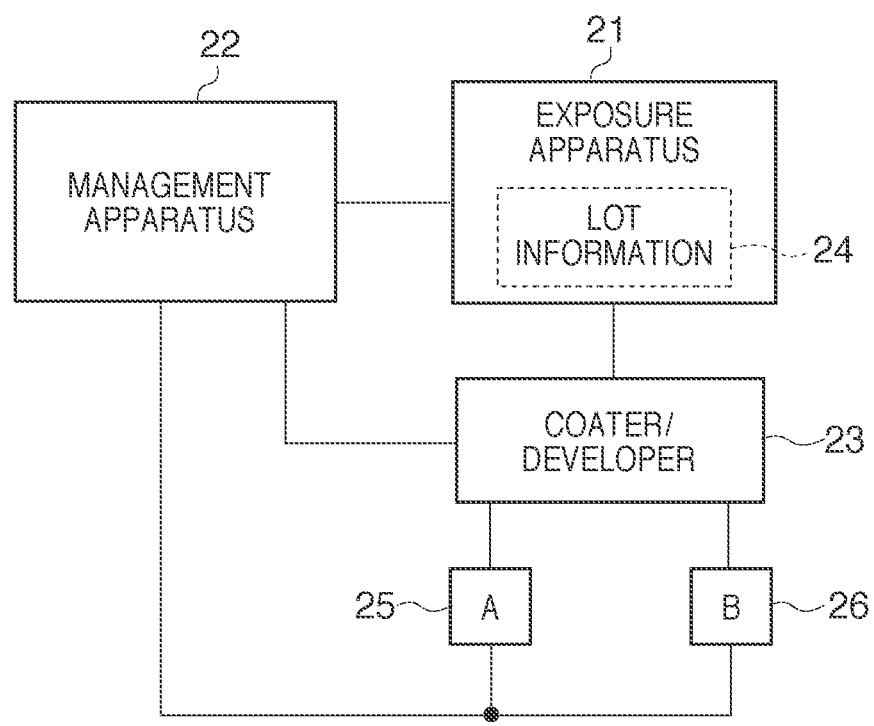
FIG. 2 is a block diagram that depicts an exposure system including a management apparatus.

FIG. 2 is a block diagram that depicts an exposure system including an exposure apparatus. In the exposure system, an exposure apparatus 21 is connected to a management apparatus 22 and a coater/developer 23 via lines. The management apparatus 22 controls process commands associated with lots A and B for which exposure processes, coating processes, and developing processes are registered in the exposure apparatus 21 and coater/developer 23. In the coater/developer 23, lots A and B stand by. Lot information concerning lots A and B is stored in a lot information storage unit 24. Note that one lot includes an arbitrary number of wafers such as 25 wafers.

Figure 3:
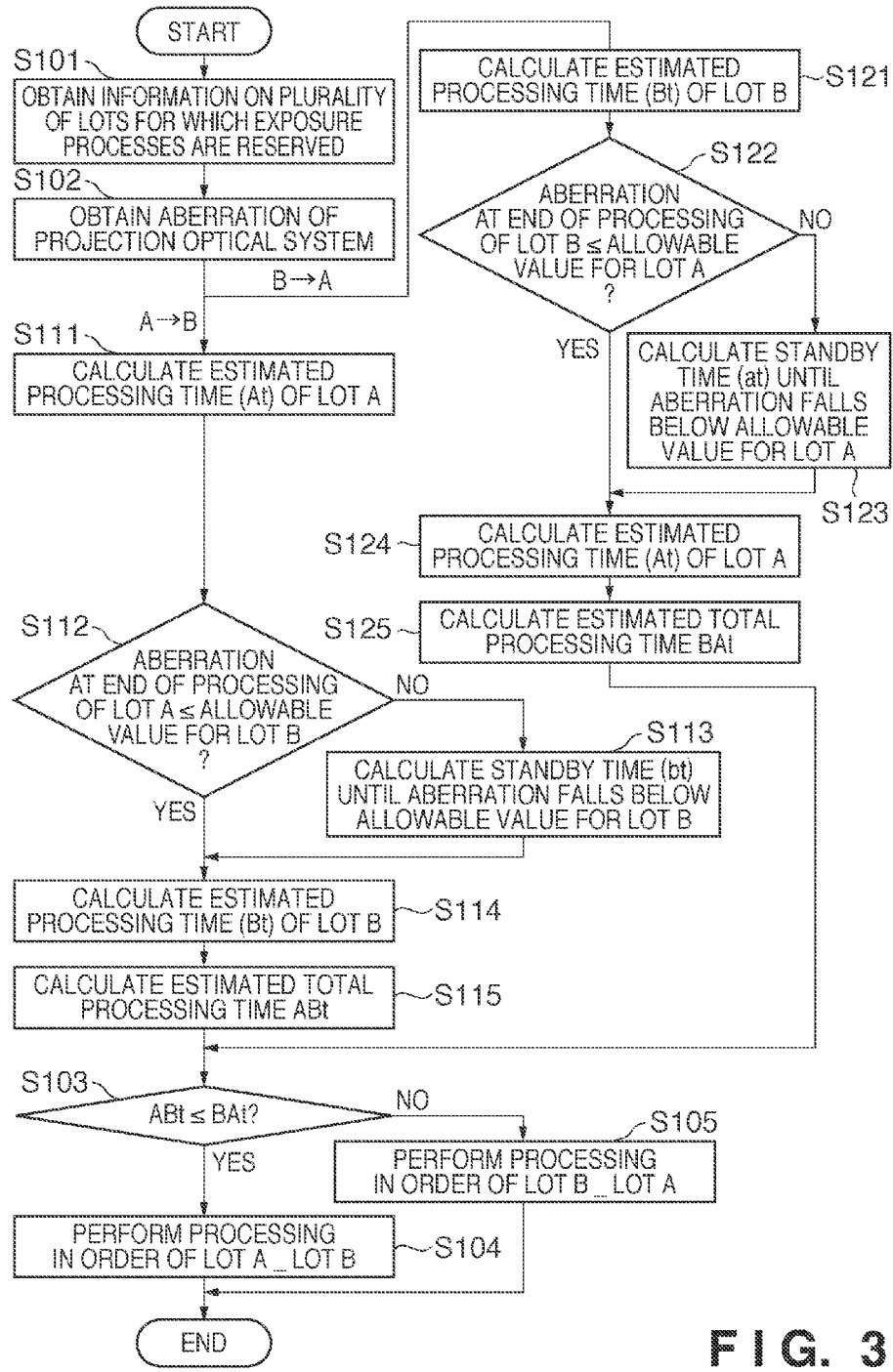
FIG. 3 is a flowchart that depicts a method of determining the processing order of lots in the first embodiment.

FIG. 3 is a flowchart for determining, by the management apparatus 22, the processing order of a plurality of lots by deciding which of lots A and B desirably undergoes an exposure process ahead of the other one, from the state shown in FIG. 2. For the sake of descriptive convenience, the first embodiment assumes that no energy load due to, for example, exposure light is imposed on the projection optical system 11 before the start of lot processing. First, in step S101, the management apparatus 22 obtains, from the lot information storage unit 24, a list of a plurality of lots for which exposure processes are reserved, and generates candidates for the processing order of a plurality of lots, based on the obtained list. In step S101 as well, the management apparatus 22 obtains the allowable value of the aberration of the projection optical system, below which an exposure process can be performed, for each of the plurality of lots. In step S102, the management apparatus 22 obtains the initial value of the aberration of the projection optical system, before the start of an exposure process, which is measured by an aberration measuring device (not shown). The aberration measuring device is built in the exposure apparatus, so the exposure apparatus itself monitors the state of the aberration of the projection optical system of its own.

In steps S111 to S125, the management apparatus 22 calculates the total processing time, taken to perform exposure processes of the plurality of lots, for each candidate of the order while adjusting the time intervals between the lots so that the aberration of the projection optical system falls below the allowable value of the aberration for a corresponding lot. That is, the total processing time means the time from the start of an exposure process of the first lot among the plurality of lots until the end of an exposure process of the last lot. In steps S111 to S115, the management apparatus 22 calculates the total processing time when lot A is processed first and lot B is processed next, whereas in steps S121 to S125, it calculates the total processing time when lot B is processed first and lot A is processed next.

Figure 4:
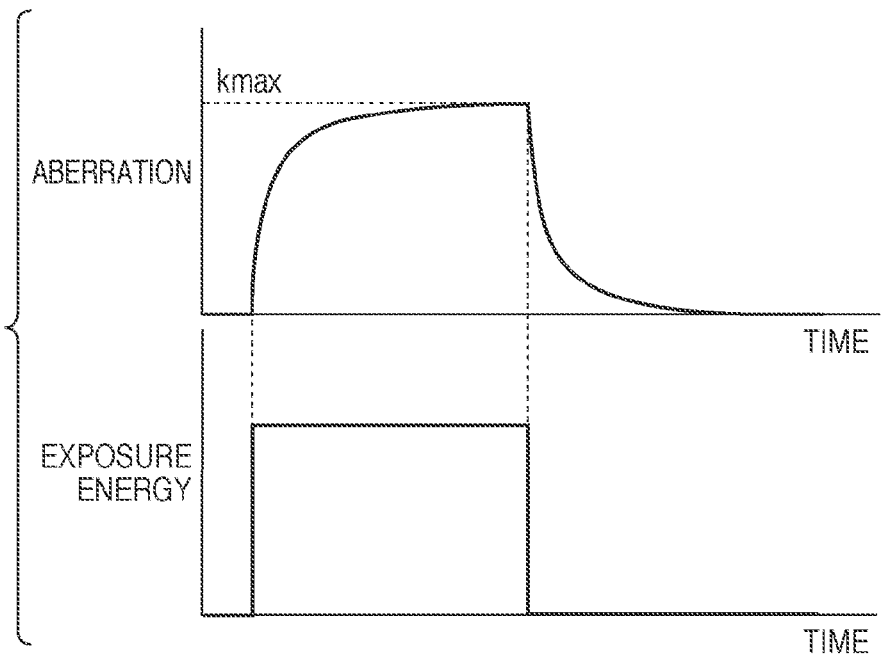
FIG. 4 is a graph that depicts a change in aberration, which accompanies an exposure process.

To calculate the total processing time by the management apparatus 22, it is necessary to estimate a change in aberration of the projection optical system upon its irradiation with exposure light. As shown in FIG. 4, the aberration of the projection optical system is known to change as it absorbs exposure light upon its irradiation with the light. An amount k of aberration generation is given by:

$$k = k\max + (M_K(t-\Delta t) - k\max)\exp(-\Delta t/K) \quad (1)$$

where K is a time constant, $M_K(t)$ is the amount of aberration generated at the time constant K upon exposure at time t, $\Delta t$ is the time elapsed from the previous time, and kmax is the saturation value of the amount of aberration generated at the time constant K upon exposure.

The time constant K and saturation value kmax differ depending on the aberration generation factors. Also, given more than one generation factor, the amount of change in aberration is the sum of the generation factors given. These parameters are calculated in advance from the exposure energy and the illumination conditions, and can then be used to estimate the current state of the aberration of the projection optical system. When the exposure stops, the amount k of aberration generation returns with time in accordance with:

$$k = M_K(t-\Delta t)\exp(-\Delta t/K) \quad (2)$$

Figure 5:
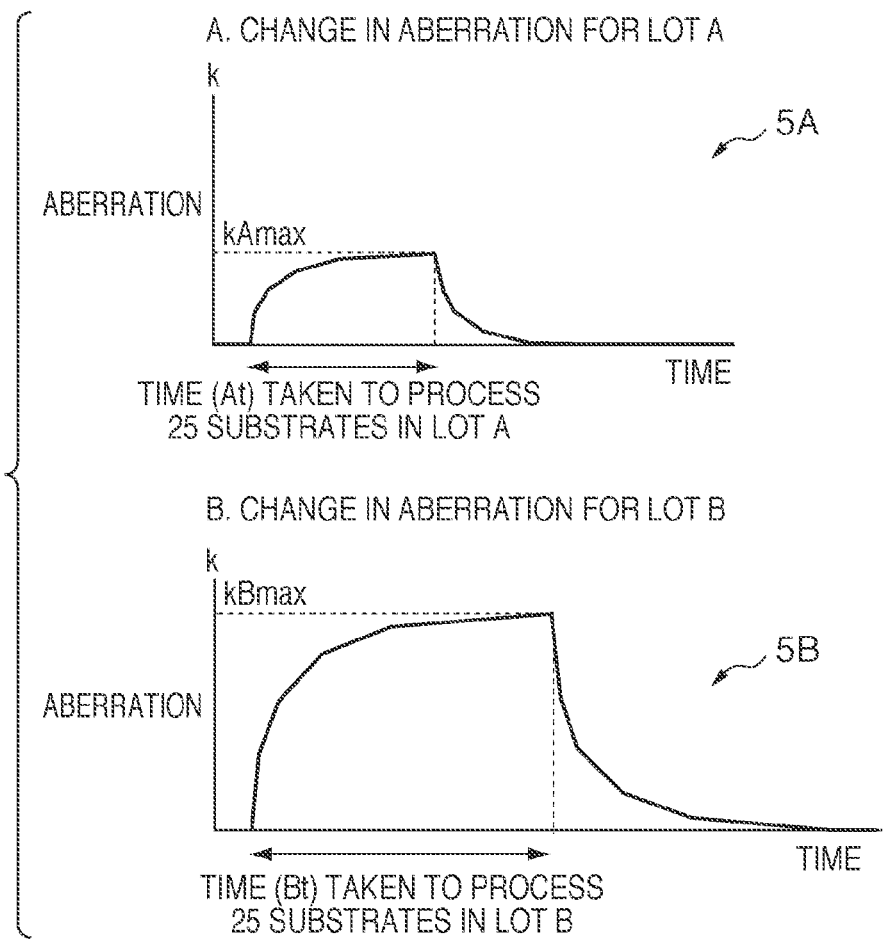
FIG. 5 is a graph that depicts changes in aberration when lots A and B, respectively, are processed.
Figure 6:
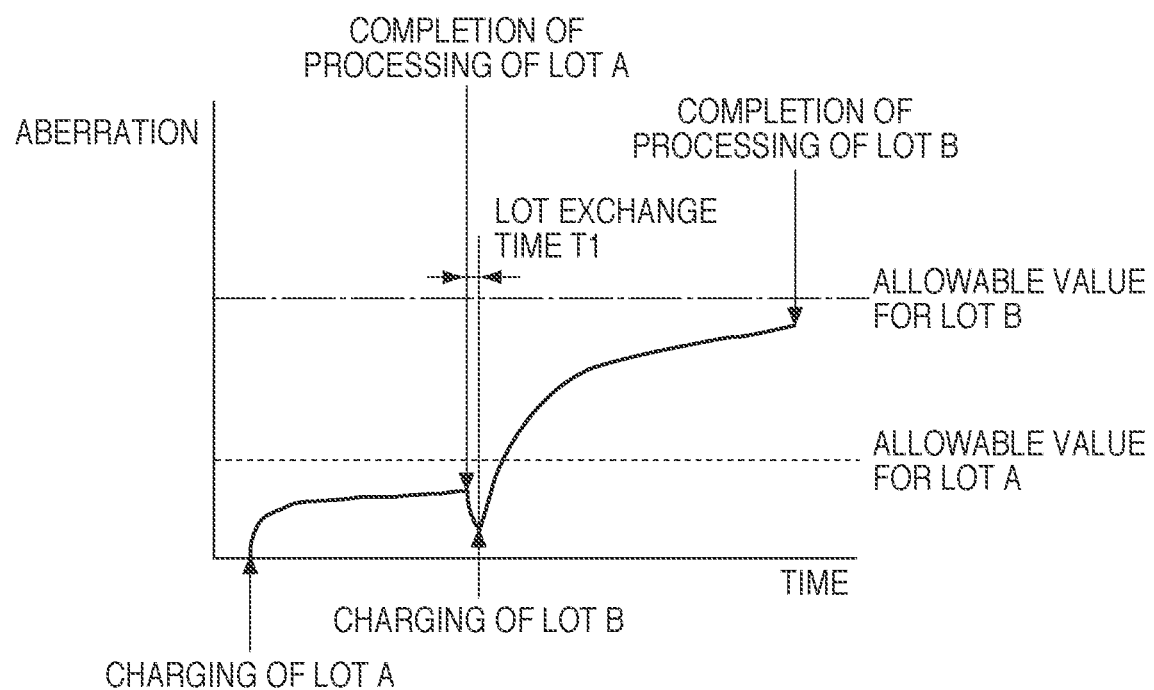
FIG. 6 is a graph that depicts a change in aberration when lots A and B are processed in this order.

The amount of light and the interval of irradiation of a lens with the light can be obtained using the pieces of information on lots and exposure processes as parameters. Hence, the time constant K and saturation value kmax are determined using optical simulation based on these pieces of information. Alternatively, the time constant K and saturation value kmax may be determined from the actual data previously obtained using the same lot. The management apparatus 22 can obtain a change in aberration of the projection optical system from the above-mentioned parameters and equations (1) and (2). Assume herein that lot A has a time constant of a change in aberration and a saturation value kAmax of aberration induced by exposure, as shown in 5A of FIG. 5, when, for example, 25 wafers are processed per lot. Similarly, assume that lot B has a time constant of a change in aberration and a saturation value kBmax of aberration induced by exposure, as shown in 5B of FIG. 5, when 25 wafers are processed per lot. First, in steps S111 to S115, the management apparatus 22 obtains the total processing time when lot A is processed first and lot B is processed next. To obtain the total processing time, it is necessary to obtain the transition of a change in aberration of the projection optical system. FIG. 6 shows a change in aberration of the projection optical system in that case. First, in step S111, the management apparatus 22 estimates the time taken to process lot A. The aberration of the projection optical system falls below an allowable value for lot A from the start of an exposure process of lot A until its end, so the exposure process of lot A may be immediately started. Hence, a processing time At of lot A is the processing time of 25 wafers, shown in 5A of FIG. 5. After that, reticle exchange and other operations required upon a change in processing lot are performed. In step S112, a time T1 after the exchange, the management apparatus 22 decides whether the estimated aberration of the projection optical system at the start of processing of lot B falls below an allowable value for lot B. In case of FIG. 6, the aberration of the projection optical system falls below the allowable value for lot B, so an exposure process of lot B may be immediately started. Hence, a processing time Bt of lot B at this time is the processing time of 25 wafers, shown in 5B of FIG. 5 (S114). In this case, the process does not advance to step S113, in which the standby time until the aberration of the projection optical system falls below the allowable value is calculated, so a standby time bt=0. In step S115, the management apparatus 22 adds the processing time At of lot A, the processing time Bt of lot B, and the standby time bt, which are obtained in the foregoing way, to calculate a total processing time ABt when lots A and B undergo exposure processes in this order.

Figure 7:
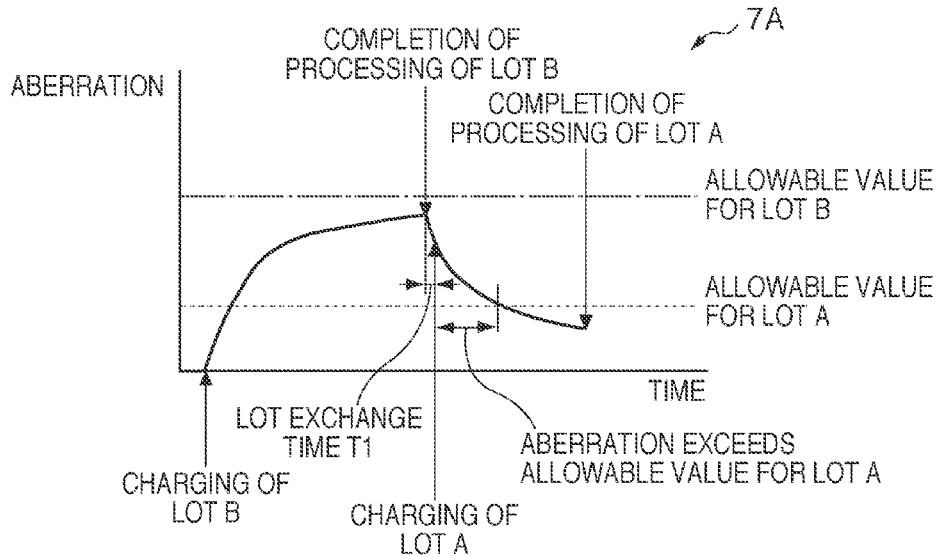
FIG. 7 is a graph that depicts changes in aberration when lots B and A are processed in this order.
Figure 7:
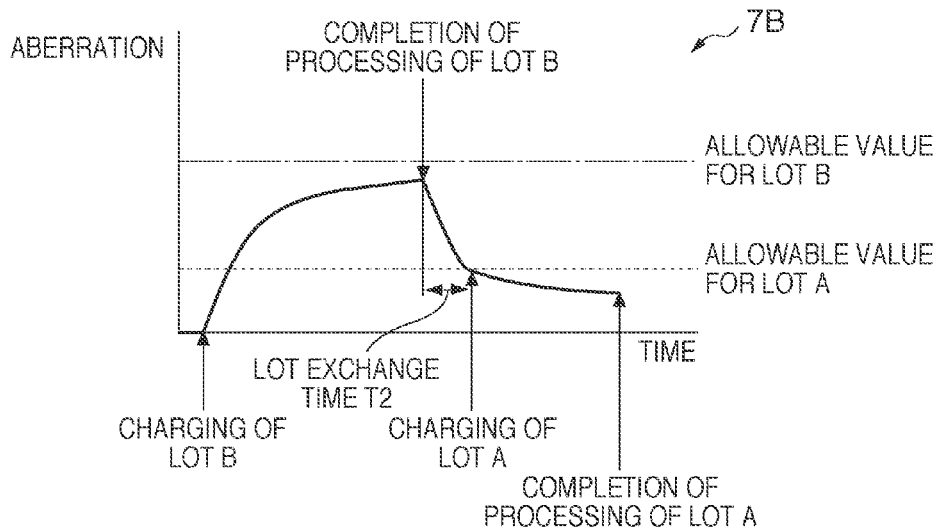

Next, in steps S121 to S125, the management apparatus 22 obtains the total processing time when lot B is processed first and lot A is processed next. In the same way as above, to obtain the total processing time, it is necessary to obtain the transition of a change in aberration of the projection optical system. 7A in FIG. 7 shows a change in aberration of the projection optical system in that case. First, in step S121, the management apparatus 22 estimates the time taken to process lot B. The aberration of the projection optical system falls below an allowable value for lot B from the start of an exposure process of lot B until its end, so the exposure process of lot B may be immediately started. Hence, a processing time Bt of lot B is the processing time of 25 wafers, shown in 5B of FIG. 5. After that, reticle exchange and other operations required upon a change in processing lot are performed. In step S122, a time T1 after the exchange, the management apparatus 22 decides whether the estimated aberration of the projection optical system at the start of processing of lot A falls below an allowable value for lot A. As can be seen from 7A in FIG. 7, the aberration of the projection optical system exceeds the allowable value for lot A, so an exposure process of lot A cannot be immediately started. In general, the aberration of the projection optical system returns to the initial value before exposure in accordance with equation (2), unless an energy load due to factors associated with exposure light is imposed on the projection optical system. Hence, in step S123, the management apparatus 22 calculates and sets the standby time (at) until the aberration of the projection optical system falls below the allowable value for lot A. 7B in FIG. 7 shows the transition of the aberration of the projection optical system upon setting a necessary standby time. As shown in 7B in FIG. 7, after the process waits until the aberration of the projection optical system lowers to the allowable value for lot A, an exposure process of lot A is started. A processing time At this time is the processing time of 25 wafers, shown in 5A of FIG. 5 (S124). In step S125, the management apparatus 22 adds the processing time Bt of lot B, the processing time At of lot A, and the standby time at, which are obtained in the foregoing way, to calculate a total processing time BAt when lots B and A undergo exposure processes in this order. After the total processing time ABt in the order of lots A and B, and the total processing time BAt in the order of lots B and A are obtained, in step S103 the management apparatus 22 compares these total processing times to determine which one is shorter. If the total processing time ABt in the order of lots A and B is shorter, the management apparatus 22 determines that lots A and B are to be processed in this order (S104). In contrast, if the total processing time BAt in the order of lots B and A is shorter, the management apparatus 22 determines that lots B and A are to be processed in this order (S105). By determining the processing order of a plurality of lots using this method, substrates in the plurality of lots can be efficiently exposed free from any positional shift.

Second Embodiment

Figure 8:
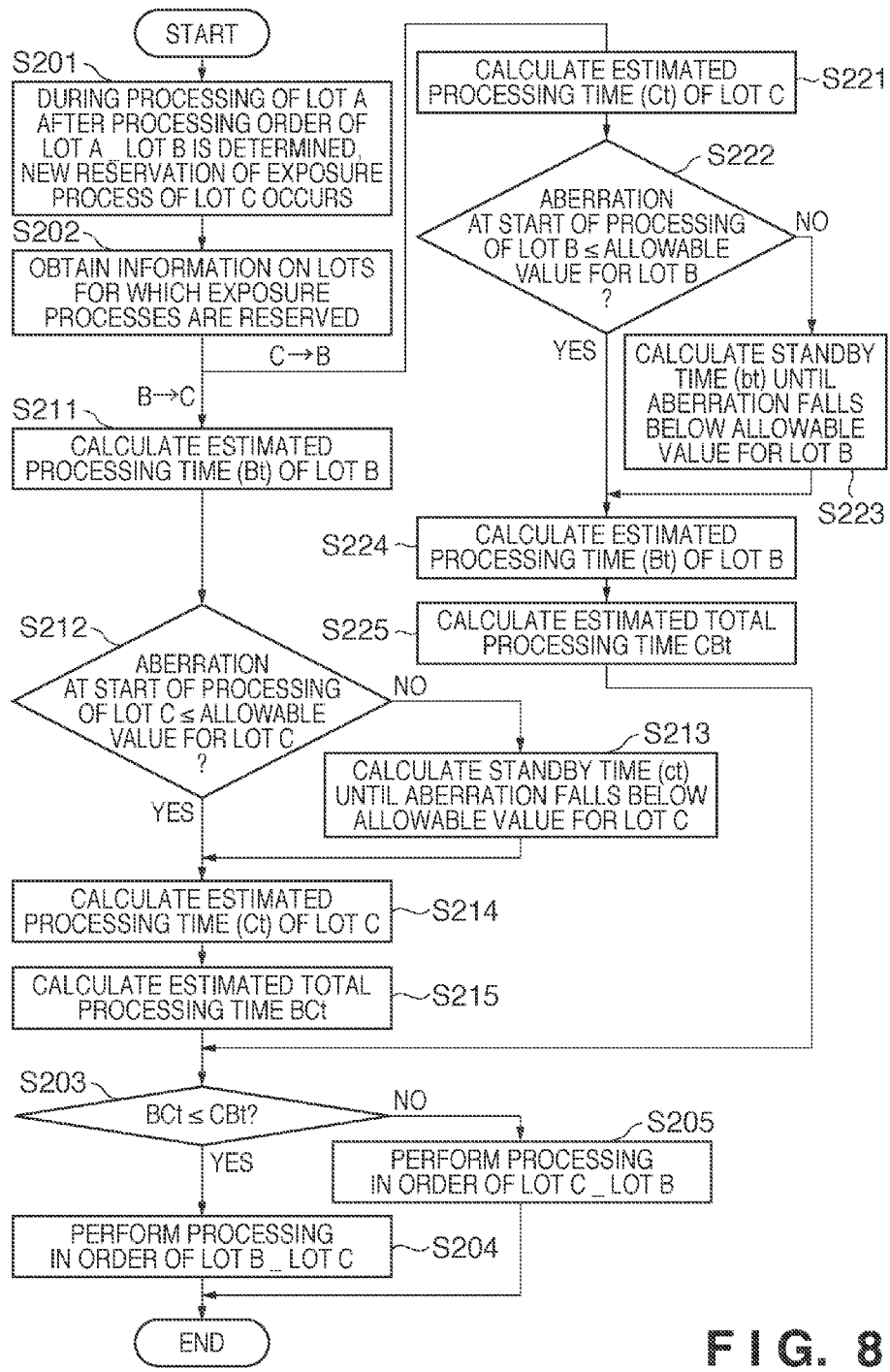
FIG. 8 is a flowchart that depicts a method of determining the processing order of lots in the second embodiment.

In the second embodiment, if an exposure process of a lot is newly reserved online after an exposure process is started, a management apparatus 22 recalculates which of the newly reserved lot and the lot which is previously scheduled to be processed next is to be processed ahead of the other one, and re-sets the processing order. FIG. 8 is a flowchart for determining the processing order in the second embodiment. First, it has been determined by the procedure in the above-described first embodiment that lot A is to be processed first and lot B is to be processed next, and processing of lot A has been started. During the processing of lot A, an exposure process of lot C is newly reserved (S201). Upon the new reservation, in step S202 and subsequent steps the management apparatus 22 performs an operation for determining which of lots B and C is to be processed next to lot A. In this case, the management apparatus 22 acquires, from a lot information storage unit 24, information on lots for which exposure processes have been or are reserved when lot C is reserved, that is, information on lots B and C (S202). Steps S211 to S225 are the same as steps S111 to S125, respectively, when lots A and B in the first embodiment are replaced with lots B and C, respectively, and a description thereof will not be given. Thus, even if a new lot is registered, the management apparatus 22 then recalculates the estimated processing times of both that lot and the remaining lot to determine which lot is to be processed next, so substrates in the plurality of lots can be efficiently exposed free from any positional shift.

Third Embodiment

Figure 9:
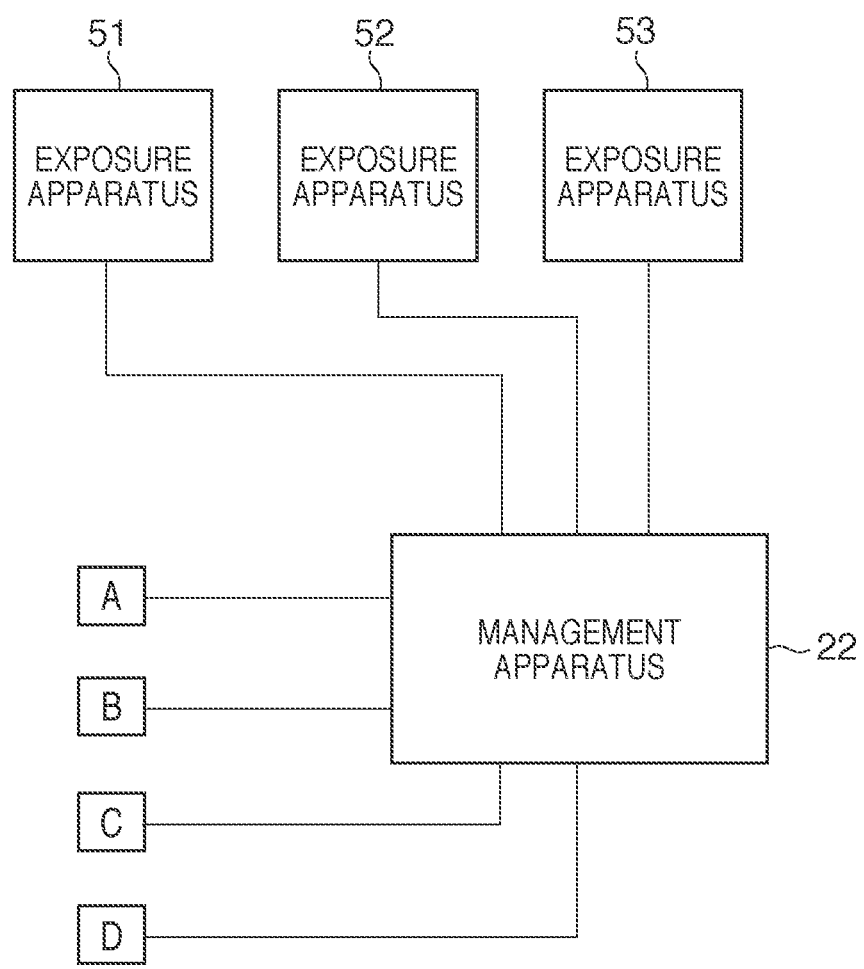
FIG. 9 is a block diagram that depicts an exposure system in the third embodiment.

In the first and second embodiments, one exposure apparatus is used to perform exposure processes of a plurality of lots. An exposure apparatus including a projection optical system having small aberrations and small variations in performance has recently become available with improved production techniques. In the third embodiment, when a plurality of exposure apparatuses are present, an exposure apparatus to which each lot is fed is determined, and exposure processes are then performed. FIG. 9 is a schematic block diagram that depicts a lithography process in a semiconductor device factory equipped with a plurality of exposure apparatuses. A plurality of exposure apparatuses 51, 52, and 53 are connected to a management apparatus 22 via lines. Information on lots A, B, C, and D for which exposure processes are reserved online is sent to the management apparatus 22 via lines (not shown).

The management apparatus 22 obtains a list of a plurality of lots A to D for which exposure processes are reserved. The management apparatus 22 also obtains the initial value of the aberration of a projection optical system of each exposure apparatus before the start of exposure processes of a plurality of lots A to D, and the allowable value of the aberration of each projection optical system, below which an exposure process can be performed, for each of a plurality of lots A to D. The management apparatus 22 assigns a plurality of lots A to D to the plurality of exposure apparatuses 51, 52, and 53 based on the obtained list, and generates candidates for a processing program, which is to be executed by the plurality of exposure apparatuses 51 to 53, and specifies the processing order of lots for each of the exposure apparatuses 51 to 53. The management apparatus 22 calculates the total processing time, from the start of an exposure process of the first lot until the end of an exposure process of the last lot, for each of the generated candidates for a processing program for each exposure apparatus while maintaining the aberration of the projection optical system in the exposure process of each of a plurality of lots below the allowable value. The management apparatus 22 determines a candidate for a processing program, according to which the total processing time taken for an exposure apparatus, the calculated total processing time of which is maximum, to perform an exposure process minimizes, as a processing program to be executed by the plurality of exposure apparatuses 51 to 53.

In the third embodiment, exposure processes of a plurality of lots need to be assigned to a plurality of exposure apparatuses. However, when exposure processes of a plurality of lots are assigned to a plurality of exposure apparatuses, and at least one of the exposure apparatuses to which the exposure processes are assigned performs exposure processes of two or more lots, the same method as in the first embodiment is used to determine the processing order of two or more lots to be processed by the exposure apparatus. In this manner, even when exposure processes of a plurality of lots are assigned to a plurality of exposure apparatuses, substrates in the plurality of lots can be efficiently exposed free from any positional shift.

A method of manufacturing a device using an exposure method which follows the processing order or processing program determined by the above-mentioned management apparatus will be described next. In this case, the device is manufactured by a step of sequentially exposing substrates in a plurality of lots, a step of developing the exposed substrates in the plurality of lots, and subsequent known steps. The device can be, for example, a semiconductor integrated circuit device or a liquid crystal display device. The substrate can be, for example, a wafer or a glass plate. The subsequent known steps include, for example, oxidation, film formation, vapor deposition, doping, planarization, dicing, bonding, and packaging steps.

Although the management apparatus 22 is separated from an exposure apparatus in the foregoing description, it may be integrated into the exposure apparatus, including the above-mentioned functions of the management apparatus 22.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-212513, filed Sep. 14, 2009, which is hereby incorporated by reference herein in its entirety.

What is claimed is:

1. A management apparatus which manages an exposure apparatus that projects a pattern of a reticle onto a substrate via a projection optical system to expose the substrate, wherein the management apparatus is configured at least to:
    obtain a list of a plurality of lots for which exposure processes are reserved, an initial value of an aberration of the projection optical system before start of the exposure processes of the plurality of lots, and an allowable value of the aberration of the projection optical system, below which the exposure process can be performed, for each of the plurality of lots,
    generate candidates for an order of the plurality of lots, for which the exposure processes are reserved, based on the obtained list,
    calculate a time, from start of an exposure process of a first lot until end of an exposure process of a last lot, for each of the generated candidates for the order while adjusting time intervals between the lots so that the aberration of the projection optical system in the exposure process of each of the plurality of lots falls below the allowable value for a corresponding lot, and
    determine a candidate for the order of the plurality of lots, for which the calculated time is minimized, the order of the plurality of lots being a processing order of the plurality of lots.

2. The apparatus according to claim 1, wherein the management apparatus is further configured at least to newly determine the order if an exposure process of a lot is newly reserved.

3. A management apparatus which manages a plurality of exposure apparatuses that project patterns of reticles onto substrates via projection optical systems to expose the substrates, wherein the management apparatus configured at least to:
    obtain a list of a plurality of lots for which exposure processes are reserved, an initial value of an aberration of each of the projection optical systems of the plurality of exposure apparatuses before start of the exposure processes of the plurality of lots, and an allowable value of the aberration of each of the projection optical systems, below which the exposure process can be performed, for each of the plurality of lots,
    assign the plurality of lots, for which the exposure processes are reserved, to the plurality of exposure apparatuses based on the obtained list, generate candidates for a processing program, which is to be executed by the plurality of exposure apparatuses, and specify a processing order of the lots for each of the exposure apparatuses to which the lots are assigned,
    calculate a time, from start of an exposure process of a first lot until end of an exposure process of a last lot, for each of the exposure apparatuses for each of the generated candidates for the processing program while adjusting time intervals between the lots so that the aberration of the projection optical system in the exposure process of each of the plurality of lots falls below the allowable value for a corresponding lot, and
    determine a candidate for the processing program which minimizes the time taken to perform an exposure process, for an exposure apparatus, for which the calculated time is maximum, the processing program configured to be executed by the plurality of exposure apparatuses.

4. The apparatus according to claim 3, wherein the management apparatus is further configured at least to newly determine the processing program if an exposure process of a lot is newly reserved.

5. A method executed by a management apparatus which manages an exposure apparatus which projects a pattern of a reticle onto a substrate via a projection optical system to expose the substrate, wherein the method comprises:
   obtaining a list of a plurality of lots for which exposure processes are reserved, an initial value of an aberration of the projection optical system before start of the exposure processes of the plurality of lots, and an allowable value of the aberration of the projection optical system, below which the exposure process can be performed, for each of the plurality of lots,
   generating candidates for an order of the plurality of lots, for which the exposure processes are reserved, based on the obtained list,
   calculating a time, from start of an exposure process of a first lot until end of an exposure process of a last lot, for each of the generated candidates for the order while adjusting time intervals between the lots so that the aberration of the projection optical system in the exposure process of each of the plurality of lots falls below the allowable value for a corresponding lot, and
   determining a candidate for the order of the plurality of lots, for which the calculated time is minimized, the order of the plurality of lots being a processing order of the plurality of lots.

6. A method executed by a management apparatus which manages a plurality of exposure apparatuses which project patterns of reticles onto substrates via projection optical systems to expose the substrates, wherein the method comprises:
   obtaining a list of a plurality of lots for which exposure processes are reserved, an initial value of an aberration of each of the projection optical systems of the plurality of exposure apparatuses before start of the exposure processes of the plurality of lots, and an allowable value of the aberration of each of the projection optical systems, below which the exposure process can be performed, for each of the plurality of lots,
   assigning the plurality of lots, for which the exposure processes are reserved, to the plurality of exposure apparatuses based on the obtained list, generating candidates for a processing program, which is to be executed by the plurality of exposure apparatuses, and specifying a processing order of the lots for each of the exposure apparatuses to which the lots are assigned,
   calculating a time, from start of an exposure process of a first lot until end of an exposure process of a last lot, for each of the exposure apparatuses for each of the generated candidates for the processing program while adjusting time intervals between the lots so that the aberration of the projection optical system in the exposure process of each of the plurality of lots falls below the allowable value for a corresponding lot, and
   determining a candidate for the processing program which minimizes the time taken to perform an exposure process, for an exposure apparatus, for which the calculated time is maximum, the processing program configured to be executed by the plurality of exposure apparatuses.

7. A method comprising:
   exposing substrates in a plurality of lots using an exposure apparatus which projects a pattern of a reticle onto a substrate via a projection optical system to expose the substrate;
   developing the exposed substrates in the plurality of lots; and
   processing the developed substrates in the plurality of lots to manufacture a device,
   wherein the exposure apparatus is managed by a management apparatus, and
   wherein the method further comprises the management apparatus;
   obtaining a list of a plurality of reserved lots for which exposure processes are reserved, an initial value of an aberration of the projection optical system before start of the exposure processes of the plurality of reserved lots, and an allowable value of the aberration of the projection optical system, below which the exposure process can be performed, for each of the plurality of reserved lots;
   generating candidates for an order of the plurality of reserved lots, for which the exposure processes are reserved, based on the obtained list;
   calculating a time, from start of an exposure process of a first lot until end of an exposure process of a last lot, for each of the generated candidates for the order while adjusting time intervals between the reserved lots so that the aberration of the projection optical system in the exposure process of each of the plurality of reserved lots falls below the allowable value for a corresponding lot; and
   determining a candidate for the order of the plurality of reserved lots, for which the calculated time is minimized, the order of the plurality of reserved lots being a processing order of the plurality of reserved lots.

8. A method comprising:
   exposing substrates in a plurality of lots using a plurality of exposure apparatuses which project patterns of reticles onto substrates via projection optical systems to expose the substrates;
   developing the exposed substrates in the plurality of lots; and
   processing the developed substrates in the plurality of lots to manufacture a device,
   wherein the plurality of exposure apparatuses are managed by a management apparatus, and
   wherein the method further comprises the management apparatus:
   obtaining a list of a plurality of reserved lots for which exposure processes are reserved, an initial value of an aberration of each of the projection optical systems of the plurality of exposure apparatuses before start of the exposure processes of the plurality of reserved lots, and an allowable value of the aberration of each of the projection optical systems, below which the exposure process can be performed, for each of the plurality of reserved lots;
   assigning the plurality of reserved lots, for which the exposure processes are reserved, to the plurality of exposure apparatuses based on the obtained list, generating candidates for a processing program, which is to be executed by the plurality of exposure apparatuses, and specifying a processing order of the reserved lots for each of the exposure apparatuses to which the reserved lots are assigned;
   calculating a time, from start of an exposure process of a first lot until end of an exposure process of a last lot, for each of the exposure apparatuses for each of the generated candidates for the processing program while adjusting time intervals between the reserved lots so that the aberration of the projection optical system in the exposure process of each of the plurality of reserved lots falls below the allowable value for a corresponding lot; and
determining a candidate for the processing program which minimizes the time taken to perform an exposure process, for an exposure apparatus, for which the calculated time is maximum, the processing program configured to be executed by the plurality of exposure apparatuses.

* * * * *